US012671438B2

(12) United States Patent
    Kobayashi

(10) Patent No.:  US 12,671,438 B2
(45) Date of Patent:      Jun. 30, 2026

(54) ANALOG-TO-DIGITAL CONVERSION CIRCUIT

(71) Applicant: Nuvoton Technology Corporation Japan, Kyoto (JP)

(72) Inventor: Hitoshi Kobayashi, Osaka (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 91 days.

(21) Appl. No.: 18/467,501

(22) Filed: Sep. 14, 2023

(65) Prior Publication Data

US 2024/0007128 A1      Jan. 4, 2024

Related U.S. Application Data

(63) Continuation of application No. PCT/JP2022/013030, filed on Mar. 22, 2022.

(30) Foreign Application Priority Data

Mar. 24, 2021    (JP) ................................. 2021-050320

(51) Int. Cl.
    *H03M 3/00*        (2006.01)
(52) U.S. Cl.
    CPC ............. *H03M 3/462* (2013.01); *H03M 3/48* (2013.01)
(58) Field of Classification Search
    CPC ......... H03M 3/48; H03M 3/458; H03M 3/462
    See application file for complete search history.

(56) References Cited

U.S. PATENT DOCUMENTS

| | | | | |
|---|---|---|---|---|
| 5,541,600 A | * | 7/1996 | Blumenkrantz | ......... H03K 7/06 341/139 |
| 2006/0071835 A1 | | 4/2006 | Inukai | |
| 2008/0070535 A1 | * | 3/2008 | Liou | ..................... H04W 52/52 455/232.1 |
| 2022/0123763 A1 | * | 4/2022 | Ray | ................... H03H 17/0621 |

FOREIGN PATENT DOCUMENTS

| | | | | |
|---|---|---|---|---|
| JP | H07-146314 A | 6/1995 | | |
| JP | 3214981 B2 | 10/2001 | | |
| JP | 2005-151312 A | 6/2005 | | |
| JP | 4122325 B2 | 7/2008 | | |
| WO | WO-2020241102 A1 | * | 12/2020 | .............. H03M 3/02 |

OTHER PUBLICATIONS

International Search Report dated Jun. 14, 2022 issued in International Patent Application No. PCT/JP2022/013030, with English translation.

* cited by examiner

*Primary Examiner* — Benyam Haile
(74) *Attorney, Agent, or Firm* — Rimon P.C.

(57) ABSTRACT

An analog-to-digital conversion circuit includes: a variable gain amplifier; a delta-sigma modulator that modulates an output of the variable gain amplifier to a pulse density modulation (PDM) signal; and a decimation filter that down-samples the PDM signal to output a first digital signal that is converted into a multi-bit digital signal. The decimation filter includes: a weight change unit that converts the PDM signal into a second digital signal that is weighted by multiplying a weight of the PDM signal by a reciprocal of an amplification factor of the variable gain amplifier; and a first digital filter that receives the second digital signal as an input, and outputs the first digital signal.

9 Claims, 11 Drawing Sheets

Figure 6:
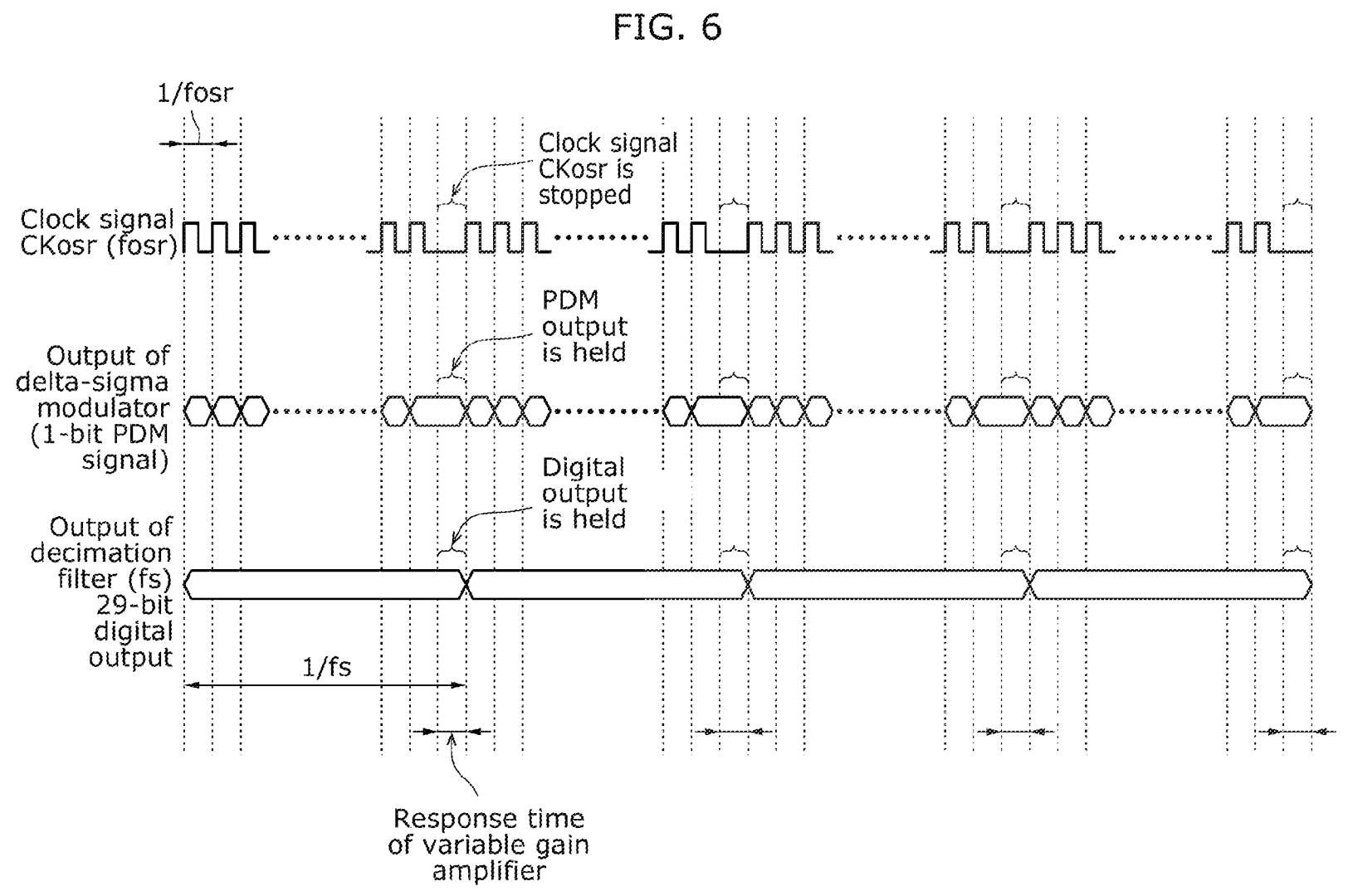

Clock signal CKosr (fosr)

Output of delta-sigma modulator (1-bit PDM signal)

Output of decimation filter (fs) 29-bit digital output

1/fosr

Clock signal CKosr is stopped

PDM output is held

Digital output is held

1/fs

Response time of variable gain amplifier

Figure 10:
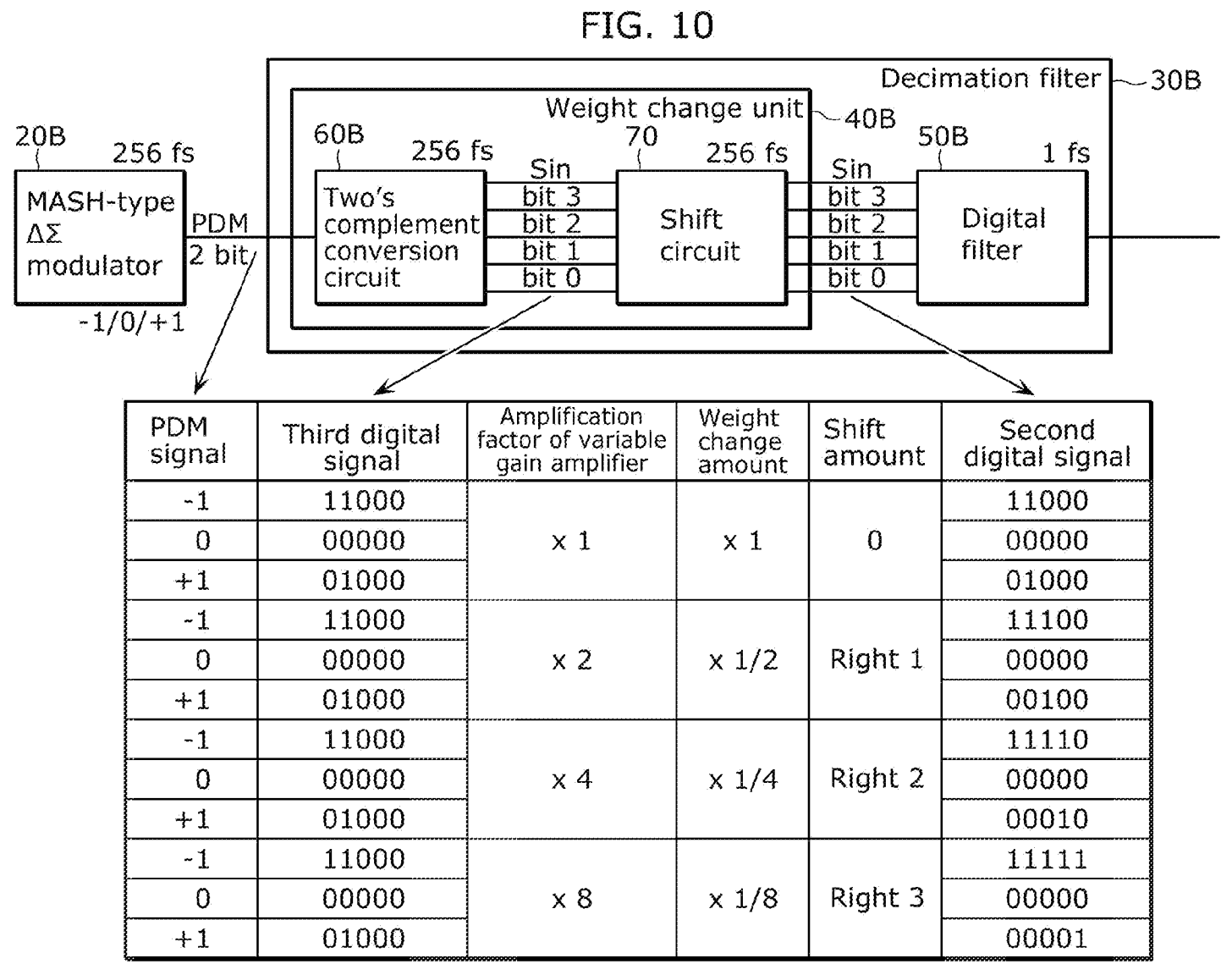

| PDM signal | Third digital signal | Amplification factor of variable gain amplifier | Weight change amount | Shift amount | Second digital signal |
|---|---|---|---|---|---|
| -1 | 11000 | × 1 | × 1 | 0 | 11000 |
| 0 | 00000 | | | | 00000 |
| +1 | 01000 | | | | 01000 |
| -1 | 11000 | × 2 | × 1/2 | Right 1 | 11100 |
| 0 | 00000 | | | | 00000 |
| +1 | 01000 | | | | 00100 |
| -1 | 11000 | × 4 | × 1/4 | Right 2 | 11110 |
| 0 | 00000 | | | | 00000 |
| +1 | 01000 | | | | 00010 |
| -1 | 11000 | × 8 | × 1/8 | Right 3 | 11111 |
| 0 | 00000 | | | | 00000 |
| +1 | 01000 | | | | 00001 |

ANALOG-TO-DIGITAL CONVERSION CIRCUIT

CROSS REFERENCE TO RELATED APPLICATIONS

This is a continuation application of PCT International Application No. PCT/JP2022/013030 filed on Mar. 22, 2022, designating the United States of America, which is based on and claims priority of Japanese Patent Application No. 2021-050320 filed on Mar. 24, 2021. The entire disclosures of the above-identified applications, including the specifications, drawings and claims are incorporated herein by reference in their entirety.

FIELD

The present disclosure relates to an analog-to-digital conversion circuit.

BACKGROUND

An analog-to-digital conversion circuit having an automatic gain control function and including the following elements is conventionally known (for example, see Patent Literature (PTL) 1): a variable gain amplifier, a delta-sigma modulator that modulates an output of the variable gain amplifier to a pulse density modulation (PDM) signal, and a decimation filter that downsamples the PDM signal to output a digital signal that is converted into a multi-bit digital signal.

CITATION LIST

Patent Literature

PTL 1: Japanese Patent No. 3214981

SUMMARY

Technical Problem

Like the analog-to-digital conversion circuit disclosed by PTL 1, a conventional analog-to-digital conversion circuit is of a type that feeds back an output of a decimation filter to the amplification factor of a variable gain amplifier. When the amplification factor is changed in such an analog-to-digital conversion circuit, an output of the analog-to-digital conversion circuit becomes unstable from a timing at which the amplification factor is changed until a lapse of a response time of the decimation filter.

In view of the above, the present disclosure aims to provide an analog-to-digital conversion circuit that can inhibit an unstable output.

Solution to Problem

An analog-to-digital conversion circuit according to one aspect of the present disclosure includes: a variable gain amplifier; a delta-sigma modulator that modulates an output of the variable gain amplifier to a pulse density modulation (PDM) signal; and a decimation filter that downsamples the PDM signal to output a first digital signal that is converted into a multi-bit digital signal. The decimation filter includes: a weight change unit that converts the PDM signal into a second digital signal that is weighted by multiplying a weight of the PDM signal by a reciprocal of an amplification factor of the variable gain amplifier; and a first digital filter that receives the second digital signal as an input, and outputs the first digital signal.

Advantageous Effects

An analog-to-digital conversion circuit according to one aspect of the present disclosure can inhibit an unstable output.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 is a block diagram illustrating one example of a configuration of an analog-to-digital conversion circuit according to Embodiment 1.

FIG. 6 is a timing diagram illustrating a state of a clock generator according to Embodiment 1 temporarily stopping the supply of a clock signal.

FIG. 8 is a block diagram illustrating one example of a configuration of an analog-to-digital conversion circuit according to Embodiment 2.

FIG. 9 is a block diagram illustrating one example of a configuration of an analog-to-digital conversion circuit according to Embodiment 3.

FIG. 10 is a block diagram illustrating one example of a configuration of a weight change unit according to Embodiment 3.

Figure 2:
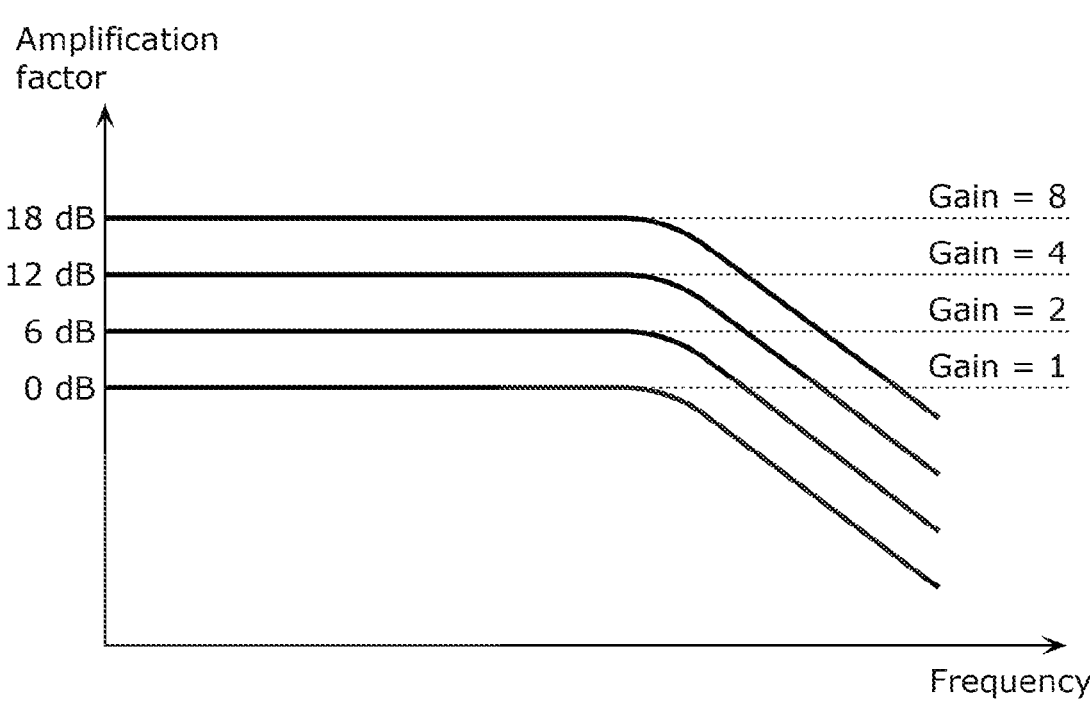
FIG. 2 is a characteristic diagram illustrating one example of a frequency property of a variable gain amplifier according to Embodiment 1.

DESCRIPTION OF EMBODIMENTS (Circumstances Leading to the Present Disclosure)

A delta-sigma-type analog-to-digital conversion circuit (hereinafter, also called a "delta-sigma ADC") includes a delta-sigma modulator and a decimation filter. The delta-sigma ADC is well known as an architecture of an analog-to-digital conversion circuit (hereinafter, also called an "ADC") that can implement a high dynamic range having the effective number of bits ranging from about 12 bits to about 16 bits and a high resolution as results of a noise shaping effect produced by oversampling the delta-sigma modulator.

The delta-sigma modulator calculates a difference (A, delta) between a signal obtained by integrating (2, sigma) an analog input signal and a signal obtained by performing digital-to-analog conversion on a digital output and being fed back, and converts the analog input signal into a PDM signal quantized to one bit or to a plurality of bits.

The decimation filter is a filter that integrates the PDM signal of one bit or a plurality of bits output from the delta-sigma modulator at an oversampling frequency (fosr) to an analog-to-digital conversion frequency (fs) to increase a resolution (the number of bits) of the PDM signal. For example, a delta-sigma ADC having a 256× oversampling rate outputs a PDM signal at a frequency of the fosr that is 256 times the fs, and a data output frequency of the decimation filter is reduced to the fs that is $\frac{1}{256}$ of the fosr. The decimation filter as described above includes a digital filter such as a SINC filter, an FIR filter, an IIR filter, etc. In order to attenuate noise that is shifted to a high frequency range as a result of noise shaping performed by the delta-sigma modulator, the decimation filter needs to include a filter having a degree greater than a degree of the delta-sigma modulator. For example, since a second-order delta-sigma ADC includes a delta-sigma modulator having a second-order degree, a post-stage decimation filter includes, in most cases, a filter having at least a third-order degree.

Since the dynamic range of an ADC is typically limited to a range of from a supply voltage of the ADC as the upper limit to thermal noise generated in the ADC as the lower limit, the dynamic range is specified by, in most cases, a signal-to-noise ratio (SNR) or the effective number of bits (SNOB). In order to correctly perform analog-to-digital conversion using an ADC, the amplitude of an analog signal to be input needs to be limited to the dynamic range of the ADC. For this reason, when the amplitude of an input signal is large and exceeds the dynamic range of an ADC, or alternatively, when the amplitude of the input signal is small and buried in thermal noise of the ADC, an amplifier or an attenuator is provided at a stage prior to the ADC to adjust an amplification factor such that the maximum input amplitude and the minimum input amplitude are within the dynamic range of the ADC.

Particularly for a system having a large fluctuation in an analog input amplitude which cannot obtain a resolution of the minimum input amplitude when the amplification factor is set at the maximum input amplitude, a variable gain amplifier (hereinafter, also called a "VGA") is provided at a stage prior to an ADC, and the amplification factor of the VGA is changed according to the input amplitude to broaden the dynamic range of the ADC. Furthermore, a system that enables the amplification factor of a VGA to automatically change according to an input amplitude is called an automatic gain control (hereinafter, also called an "AGC").

An example of implementing an AGC by connecting a VGA to an ADC is disclosed by, for example, PTL 1. Particularly, as disclosed by PTL 1, a method in which the variable range of the amplification factor of a VGA is discrete, a digital circuit determines the magnitude of a digital output amplitude, and a VGA is controlled by means of feedback is called a digital AGC.

However, a digital AGC that, like the configuration disclosed by PTL 1, connects a VGA and a delta-sigma ADC, and detects a digital output amplitude of a digital signal output from a decimation filter in a digital circuit to control the amplification factor of the VGA by means of feedback poses a problem of a response time of the decimation filter which is generated at the time of switching the amplification factor of the VGA. When the amplification factor of the VGA is switched in the above-described configuration, output data fluctuates, even in the shortest time, during a sampling period (1/fs) of a degree of the decimation filter due to a step response.

Figure 11:
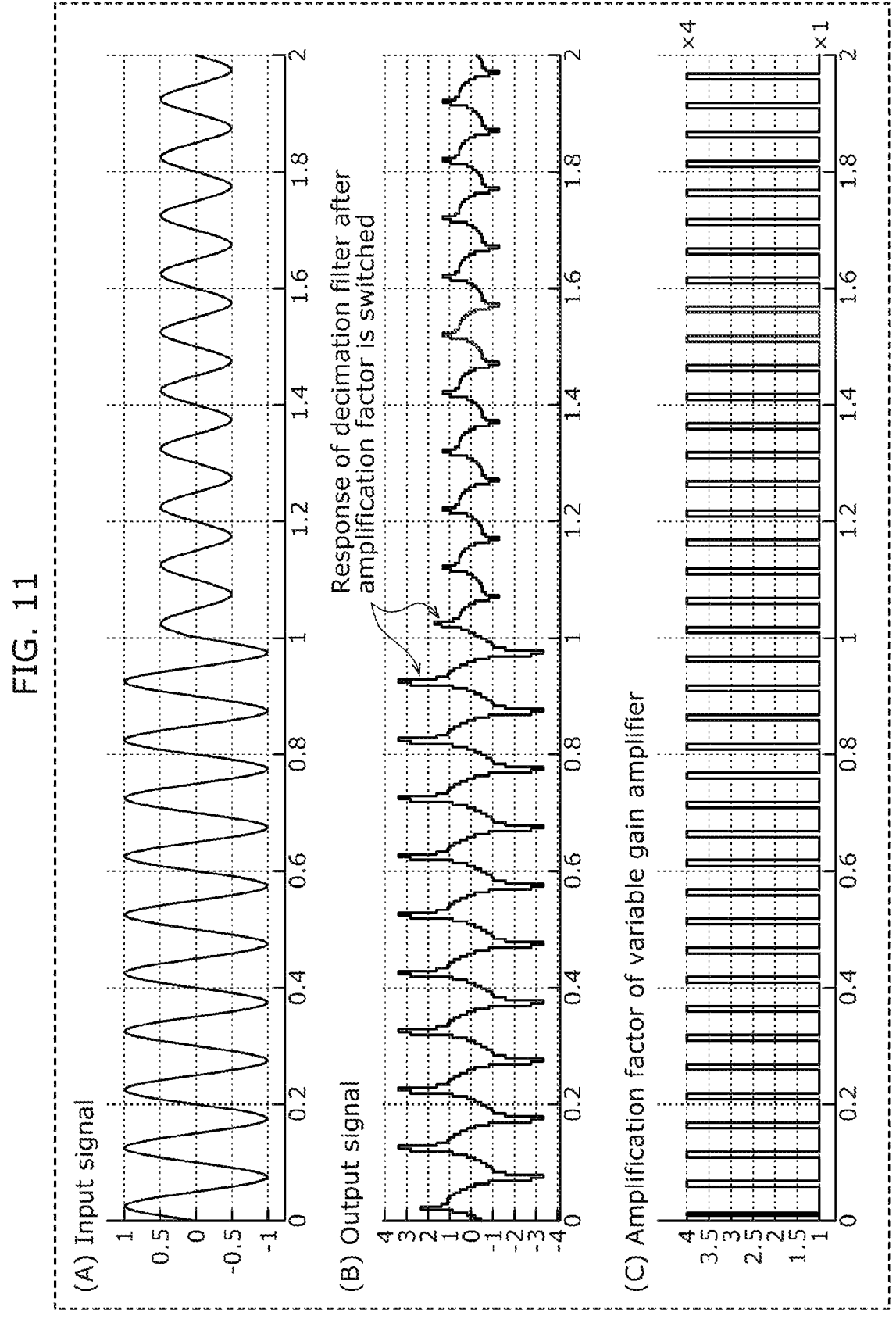
FIG. 11 is a waveform chart illustrating one example of a waveform of an output resulting from automatic gain control performed in a conventional configuration.

FIG. 11 illustrates one example of a waveform of a step response appeared in a waveform of an output of a decimation filter when an AGC is controlled by the conventional configuration. Here, the amplification factor of a VGA is changed to a factor of four when an input signal amplitude falls below a reference level, and the amplification factor of the VGA is changed to a factor of one when the input signal amplitude exceeds the reference level. In this example of the waveform, an output of the decimation filter is fluctuated when VGA gain is switched, and digital conversion is not correctly performed on an input signal.

In order to inhibit a step response at switching of the amplification factor of a VGA from affecting an output signal, a typical, conventional digital AGC disclosed by PTL 1 is, in practice, designed as follows for avoiding a system-wise effect: (i) the variable range of an amplification factor of the VGA is reduced such that a step response at switching of the amplification factor of the VGA is reduced as much as possible, (ii) a loop filter having a sufficiently large time constant is inserted into a feedback loop of the AGC such that a variation in the amplification factor is slight, and (iii) a response of the feedback loop of the AGC is set. Alternatively, when an AGC is caused to respond rapidly, data before the amplification factor of the VGA is switched is held until a time at which a response of a decimation filter is stable when the amplification factor of the VGA is varied, so that the AGC can ignore a step response when the amplification factor of the VGA is varied. In all cases, a conventional AGC that uses a delta-sigma ADC poses a problem that analog-to-digital conversion cannot be performed while varying the amplification factor of a VGA at a speed faster than a response time of a decimation filter.

In view of the above, the inventors have repeatedly and diligently conducted reviews and experiments to develop an analog-to-digital converter that can perform analog-to-digital conversion even if the amplification factor of a VGA is varied at a speed faster than a response time of a decimation filter. As a result, the inventors have arrived at the following analog-to-digital conversion circuit that can inhibit an unstable output.

An analog-to-digital conversion circuit according to one aspect of the present disclosure includes: a variable gain amplifier; a delta-sigma modulator that modulates an output of the variable gain amplifier to a pulse density modulation (PDM) signal; and a decimation filter that downsamples the PDM signal to output a first digital signal that is converted into a multi-bit digital signal. The decimation filter includes: a weight change unit that converts the PDM signal into a second digital signal that is weighted by multiplying a weight of the PDM signal by a reciprocal of an amplification factor of the variable gain amplifier; and a first digital filter that receives the second digital signal as an input, and outputs the first digital signal.

When the amplification factor of a variable gain amplifier is increased by a factor of k (k is an optional number greater than zero) in an analog-to-digital conversion circuit having the above-described configuration, the weight of a PDM signal is increased by a factor of k, whereas the weight of a second digital signal is further increased by a factor of one-kth. Accordingly, the weight of the second digital signal does not change. For this reason, the analog-to-digital conversion circuit having the above-described configuration can perform analog-to-digital conversion even if the amplification factor of a variable gain amplifier is changed at a speed faster than a response time of a decimation filter.

As described above, the analog-to-digital conversion circuit having the above-described configuration can inhibit an unstable output.

In addition, the amplification factor may be a power of two. The weight change unit may include: a two's complement conversion circuit that converts the PDM signal into a third digital signal in two's complement notation which is weighted by a same weight as the PDM signal; and a shift circuit that, when the amplification factor is two to a power of n where n is an integer of zero or more, performs an arithmetic right shift of n bits on the third digital signal to output the second digital signal.

With this, a weight change unit can implement a configuration not including a circuit having a relatively large circuit size such as a divider.

Moreover, the analog-to-digital conversion circuit may further include a gain controller that changes the amplification factor based on a value of the first digital signal.

With this, an output of a decimation filter can be fed back to the amplification factor of a variable gain amplifier.

In addition, the gain controller may change the amplification factor as follows: (i) when an absolute value obtained by multiplying the value of the first digital signal by the amplification factor is greater than a first reference level, the amplification factor is halved; and (ii) when the absolute value is less than a second reference level that is less than half the first reference level, the amplification factor is doubled.

With this, a change in the amplification factor of a variable gain amplifier can be made with hysteresis. Therefore, a change in the amplification factor of the variable gain amplifier can be made stable.

Moreover, the decimation filter may output the first digital signal in a first period, and the gain controller may change the amplification factor in the first period.

With this, a change in the amplification factor of a variable gain amplifier can be caused to synchronize with the period of an output of a decimation filter.

In addition, the first digital filter may include: a second digital filter that receives the second digital signal as an input, and outputs a fourth digital signal having a total number of bits less than a total number of bits of the first digital signal; and a third digital filter that receives the fourth digital signal as an input, and outputs the first digital signal. The analog-to-digital conversion circuit may further include a gain controller that changes the amplification factor based on a value of the fourth digital signal.

With this, the circuit size of a gain controller can be reduced.

Moreover, the delta-sigma modulator may temporarily hold a value of the PDM signal in synchronization with a timing of the gain controller switching the amplification factor.

With this, it is possible to inhibit an effect of a response time taken when the amplification factor of a variable gain amplifier is changed to be exerted on an input to a decimation filter. For this reason, an unstable output from an analog-to-digital conversion circuit can further be inhibited.

Hereinafter, specific examples of an analog-to-digital conversion circuit according to one aspect of the present disclosure will be described with reference to the drawings. The embodiments described below each show a specific example of the present disclosure. The numerical values, shapes, elements, the arrangement and connection of the elements, etc. presented in the embodiments below are mere examples, and thus are not intended to limit the present disclosure. Note that the drawings are schematic diagrams, and do not necessarily provide strictly accurate illustrations.

Embodiment 1

Figure 1:
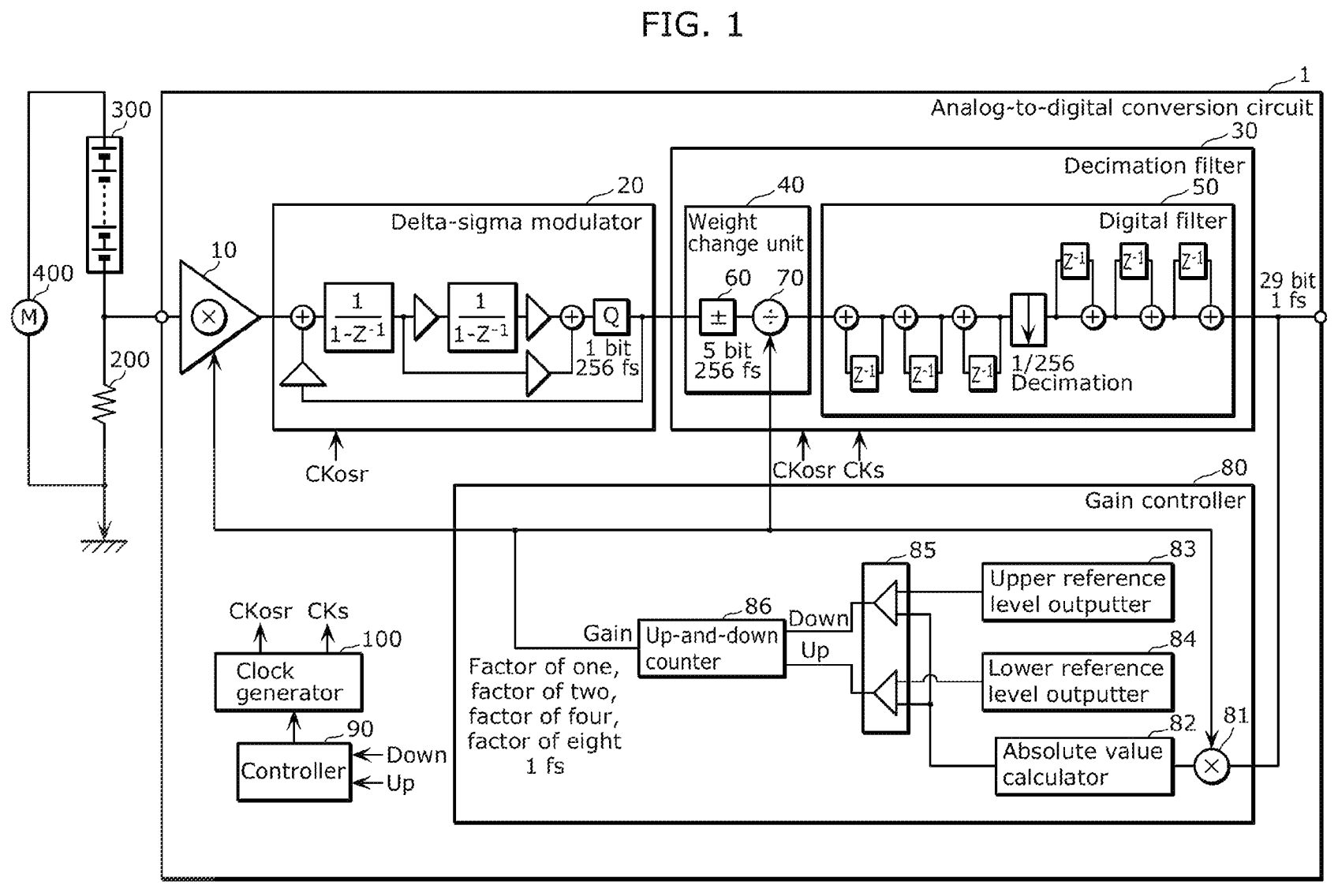

FIG. 1 is a block diagram illustrating one example of a configuration of analog-to-digital conversion circuit 1 according to Embodiment 1.

Here, as one example, analog-to-digital conversion circuit 1 will be described as a circuit that converts a voltage applied to shunt resistor 200 connected in series with assembled battery 300 and load 400 into a digital value, and outputs a digital signal. Load 400 is, for example, a motor that drives an electric vehicle, and assembled battery 300 is, for example, a lithium-ion battery that drives the motor.

As illustrated in FIG. 1, analog-to-digital conversion circuit 1 includes variable gain amplifier 10, delta-sigma modulator 20, decimation filter 30, gain controller 80, controller 90, and clock generator 100.

Variable gain amplifier 10 amplifies an analog signal input by only the amplification factor indicated by a GAIN signal, that is to be described later, and outputs the amplified analog signal.

FIG. 2 is a characteristic diagram illustrating one example of a frequency property of variable gain amplifier 10.

As illustrated in FIG. 2, the amplification factor of variable gain amplifier 10 is described here as a power of two. More specifically, the amplification factor of variable gain amplifier 10 is described here as an amplification factor set to any of the following amplification factors: a factor of one represented by two to the power of zero, a factor of two represented by two to the power of one, a factor of four represented by two to the power of two, and a factor of eight represented by two to the power of three.

The description of analog-to-digital conversion circuit 1 will be resumed with reference to FIG. 1 again.

Delta-sigma modulator 20 modulates an output of variable gain amplifier 10 to a pulse density modulation (PDM) signal, and outputs the PDM signal. Here, delta-sigma modulator 20 will be described as a delta-sigma modulator that has a second-order degree, performs oversampling at oversampling frequency fosr that is 256 times sampling frequency fs of analog-to-digital conversion circuit 1, and outputs, at oversampling frequency fosr, a PDM signal of one bit indicating values of a binary number, which are +1 and −1.

Decimation filter 30 downsamples a PDM signal output from delta-sigma modulator 20 to output a first digital signal that is converted into a multi-bit digital signal. Here, decimation filter 30 will be described as a decimation filter that performs downsampling at sampling frequency fs that is $\frac{1}{256}$ of oversampling frequency fosr to output a first digital signal of 29 bits.

As illustrated in FIG. 1, decimation filter 30 includes weight change unit 40 and digital filter 50.

Weight change unit 40 converts a PDM signal output from delta-sigma modulator 20 into a second digital signal weighted by multiplying the weight of the PDM signal by a reciprocal of the amplification factor of variable gain amplifier 10.

Figure 3:
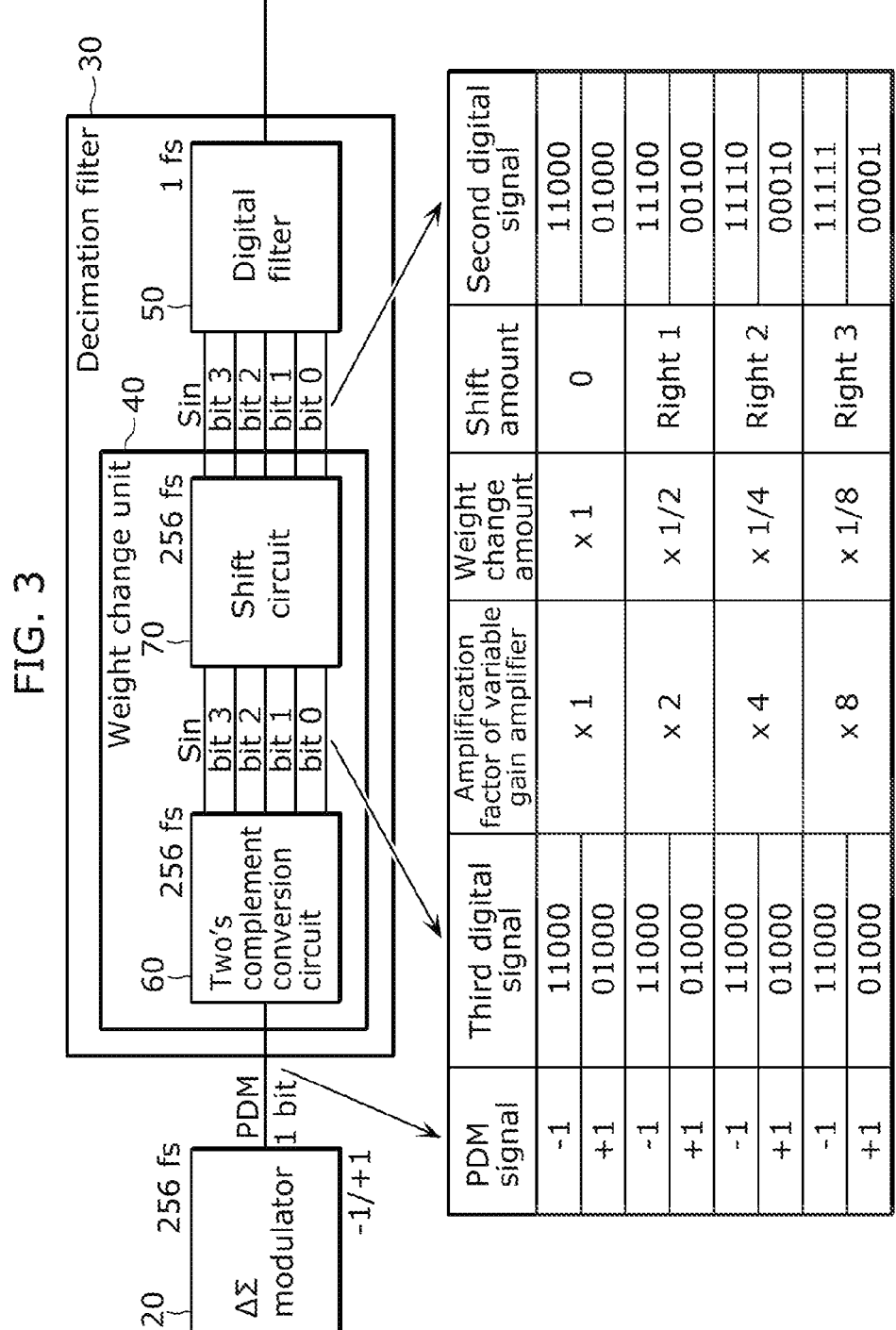
FIG. 3 is a block diagram illustrating one example of a configuration of a weight change unit according to Embodiment 1.

FIG. 3 is a block diagram illustrating one example of a configuration of weight change unit 40.

As illustrated in FIG. 3, weight change unit 40 includes two's complement conversion circuit 60 and shift circuit 70.

Two's complement conversion circuit 60 converts a PDM signal into a third digital signal in two's complement notation which is weighted by the same weight as the PDM signal. Here, a third digital signal is a signed digital signal of five bits. More specifically, two's complement conversion circuit 60 operates at oversampling frequency fosr that is 256 times the fs, converts a PDM signal indicating a value of +1 into a third digital signal indicating 01000, and converts a PDM signal indicating a value of −1 into a third digital signal indicating 11000, as illustrated in FIG. 3.

Shift circuit 70 performs, when the amplification factor of variable gain amplifier 10 is two to the power of n (n is an integer of zero or more), an arithmetic right shift of n bits on the third digital signal to output a second digital signal weighted by multiplying the weight of a PDM signal by a reciprocal of the amplification factor of variable gain amplifier 10. More specifically, as illustrated in FIG. 3, shift circuit 70 operates at oversampling frequency fosr that is 256 times the fs, and (1) when the amplification factor of variable gain amplifier 10 is a factor of one, performs an arithmetic right shift of zero bit on a third digital signal to output a second digital signal weighted by increasing the weight of a PDM signal by a factor of one, (2) when the amplification factor of variable gain amplifier 10 is a factor of two, performs an arithmetic right shift of one bit on a third digital signal to output a second digital signal weighted by increasing the weight of a PDM signal by a factor of one-half, (3) when the amplification factor of variable gain amplifier 10 is a factor of four, performs an arithmetic right shift of two bits on a third digital signal to output a second digital signal weighted by increasing the weight of a PDM signal by a factor of one-fourth, and (4) when the amplification factor of variable gain amplifier 10 is a factor of eight, performs an arithmetic right shift of three bits on a third digital signal to output a second digital signal weighted by increasing the weight of a PDM signal by a factor of one-eighth.

As described above, weight change unit 40 exemplified in FIG. 3 is implemented by a configuration not including a circuit having a relatively large circuit size such as a divider. For this reason, a PDM signal can be converted into a third digital signal in a relatively short time.

The description of analog-to-digital conversion circuit 1 will be resumed with reference to FIG. 1 again.

Digital filter 50 is a digital filter that receives a second digital signal as an input, and outputs a first digital signal. Here, digital filter 50 will be described as a digital filter that has a third-order degree that is greater than the degree of delta-sigma modulator 20, and downsamples a second digital signal at sampling frequency fs that is 1/256 of oversampling frequency fosr to output a first digital signal of 29 bits. Digital filter 50 may include, for example, a SINC filter, an FIR filter, or an IIR filter.

Figure 4:
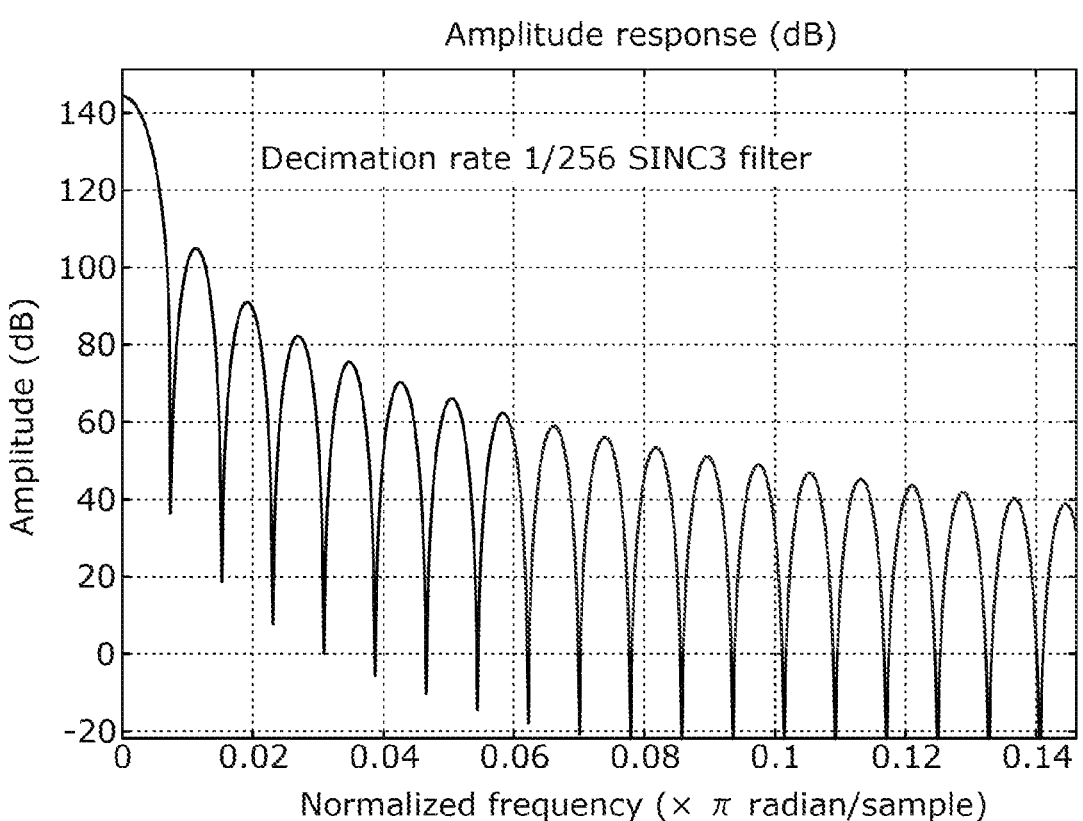
FIG. 4 is a characteristic diagram illustrating one example of a frequency property of a digital filter according to Embodiment 1.

FIG. 4 is a characteristic diagram illustrating one example of a frequency property of digital filter 50 including a third-order SINC filter whose decimation factor is 1/256.

The description of analog-to-digital conversion circuit 1 will be resumed with reference to FIG. 1 again.

Gain controller 80 changes the amplification factor of variable gain amplifier 10 based on a value of a first digital signal. Moreover, gain controller 80 outputs a GAIN signal indicating the amplification factor. Here, gain controller 80 will be described as a gain controller that changes the amplification factor by sampling frequency fs of a first digital signal, and the amplification factor is changed as follows: (i) when an absolute value obtained by multiplying a value of the first digital signal by the amplification factor is greater than a first reference level, the amplification factor is halved, and (ii) when an absolute value obtained by multiplying the value of the first digital signal by the amplification factor is less than a second reference level that is less than half the first reference level, the amplification factor is doubled.

As illustrated in FIG. 1, gain controller 80 includes multiplier 81, absolute value calculator 82, upper reference level outputter 83, lower reference level outputter 84, comparator 85, and up-and-down counter 86.

Multiplier 81 multiplies the value of a first digital signal by the amplification factor indicated by a GAIN signal. Multiplier 81 then outputs an amplified signal obtained by multiplying the value of the first digital signal by the amplification factor.

Absolute value calculator 82 calculates an absolute value of the value indicated by the amplified signal output from multiplier 81. Multiplier 81 then outputs an absolute value signal indicating the absolute value of the value indicated by the amplified signal.

Upper reference level outputter 83 outputs an upper reference level signal indicating a predetermined upper reference level.

Lower reference level outputter 84 outputs a lower reference level signal indicating a predetermined lower reference level that indicates a value less than the value of the upper reference level.

Comparator 85 compares an absolute value indicated by an absolute value signal output from absolute value calculator 82 with (i) the upper reference level indicated by an upper reference level signal output from upper reference level outputter 83, and (ii) the lower reference level indicated by a lower reference level signal output from lower reference level outputter 84. More specifically, comparator 85 outputs (1) a Down signal when the absolute value indicated by the absolute value signal is greater than or equal to the upper reference level indicated by the upper reference level signal, and (2) an Up signal when the absolute value indicated by the absolute value signal is less than or equal to the lower reference level indicated by the lower reference level signal.

Up-and-down counter 86 is a counter that holds a GAIN signal indicating the amplification factor of variable gain amplifier 10, and outputs the GAIN signal held. Up-and-down counter 86 changes the GAIN signal held such that (1) the amplification factor is half the amplification factor indicated by the GAIN signal, when a Down signal is output from comparator 85, and (2) the amplification factor is twice the amplification factor indicated by the GAIN signal, when an Up signal is output from comparator 85.

According to the above-described configuration, gain controller changes the amplification factor indicated by the GAIN signal in a period (here, 1/fs) of a first digital signal output from decimation filter 30.

Inclusion of gain controller 80 having the above-described configuration enables analog-to-digital conversion circuit 1 to feed back an output of decimation filter 30 to the amplification factor of variable gain amplifier 10.

Figure 5:
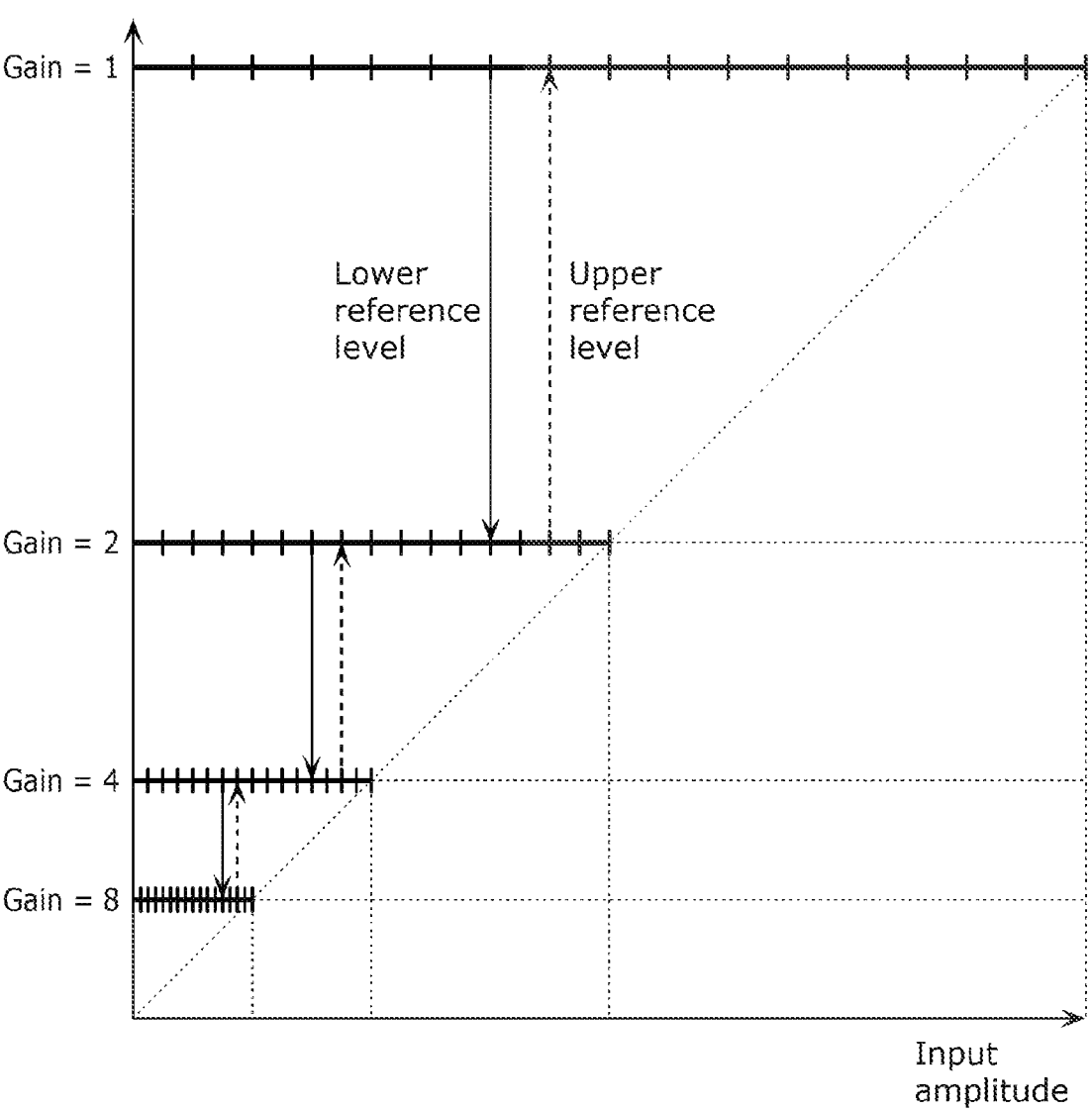
FIG. 5 is a schematic diagram illustrating an operation of switching an amplification factor which is performed by the analog-to-digital conversion circuit according to Embodiment 1.

FIG. 5 is a schematic diagram illustrating an operation of switching the amplification factor of variable gain amplifier 10 which is performed by analog-to-digital conversion circuit 1. In FIG. 5, the vertical axis represents the amplification factor of variable gain amplifier 10, and the horizontal axis represents the dynamic range of analog-to-digital conversion circuit 1 at the amplification factor. In addition, the widths of calibration marks in the horizontal axis direction at each amplification factor denote the resolution of analog-to-digital conversion circuit 1 at the amplification factor.

As illustrated in FIG. 5, analog-to-digital conversion circuit 1 feeds back an output of decimation filter 30 to the amplification factor of variable gain amplifier 10 to implement an automatic gain control function.

The description of analog-to-digital conversion circuit 1 will be resumed with reference to FIG. 1 again.

Clock generator 100 generates clock signal CKosr having a frequency of the fosr and clock signal CKs having a frequency of the fs, and supplies (i) the generated clock signal CKosr to delta-sigma modulator 20 and decimation filter 30, and (ii) the generated clock signal CKs to decimation filter 30.

Controller 90 controls clock generator 100. More specifically, a Down signal and an Up signal output from comparator 85 are input to controller 90. When a Down signal or an Up signal is input, controller 90 temporarily stops the supply of clock signal CKosr supplied by clock generator 100. Here, a time period during which the supply of clock signal CKosr supplied by clock generator 100 is temporarily stopped will be described as a time period of a response time taken when the amplification factor of variable gain amplifier 10 is changed.

FIG. 6 is a timing diagram illustrating a state of clock generator 100 temporarily stopping the supply of clock signal CKosr.

Under control of controller 90, clock generator 100 temporarily stops the supply of clock signal CKosr at a timing at which a Down signal or an Up signal is output from comparator 85, or, in other words, a timing at which the amplification factor of variable gain amplifier 10 is switched.

Accordingly, delta-sigma modulator 20 temporarily holds the value of a PDM signal in synchronization with the timing of gain controller 80 switching the amplification factor of variable gain amplifier 10.

As with a typical variable gain amplifier, variable gain amplifier 10 has a low pass filter property as illustrated in FIG. 2. Variable gain amplifier 10 having the low pass filter property may output an output signal obtained by, for instance, multiplying an input signal by a step response of variable gain amplifier 10, when the amplification factor is discretely changed, or, in other words, when the amplification factor is abruptly changed.

For this reason, when the amplification factor of variable gain amplifier 10 is discretely changed, a fixed amount of time according to the frequency property of variable gain amplifier 10 is necessary until the output signal becomes stable.

Meanwhile, when a PDM signal multiplied by the step response of variable gain amplifier 10 is input to decimation filter 30, a fixed amount of time according to the frequency property of decimation filter 30 is necessary until an output of decimation filter 30 becomes stable.

Typically, a frequency property of a variable gain amplifier is designed such that the variable gain amplifier has a cutoff frequency sufficiently higher than the oversampling frequency (fosr) of a delta-sigma modulator. Accordingly, the response time taken when the amplification factor of a variable gain amplifier is changed converges in a very short time period. In contrast, a typical frequency property of a decimation filter is that the decimation filter has a very low cutoff frequency. Accordingly, an effect of the step response on the decimation filter lasts for a long time.

For this reason, analog-to-digital conversion circuit 1 temporarily stops the supply of clock signal CKosr during a time period of a response time taken when the amplification factor of variable gain amplifier 10 is changed to implement a function of temporarily holding the value of a PDM signal.

As described above, analog-to-digital conversion circuit 1 has a function of temporarily holding the value of a PDM signal. Accordingly, by designing a frequency property of variable gain amplifier 10 such that variable gain amplifier 10 has a cutoff frequency sufficiently higher than the oversampling frequency (fosr) of delta-sigma modulator 20, the time period of temporarily holding the value of a PDM signal can be considerably shortened, and thus an effect on analog-to-digital conversion can be suppressed.

[Study]

When the amplification factor of variable gain amplifier 10 is increased by a factor of k in analog-to-digital conversion circuit 1 having the above-described configuration, the weight of a PDM signal is increased by a factor of k whereas the weight of a second digital signal is further increased by a factor of one-kth. Accordingly, the weight of the second digital signal does not change. For this reason, analog-to-digital conversion circuit 1 having the above-described configuration can perform analog-to-digital conversion, even if the amplification factor of variable gain amplifier 10 is changed at a speed faster than a response time of decimation filter 30.

Figure 7:
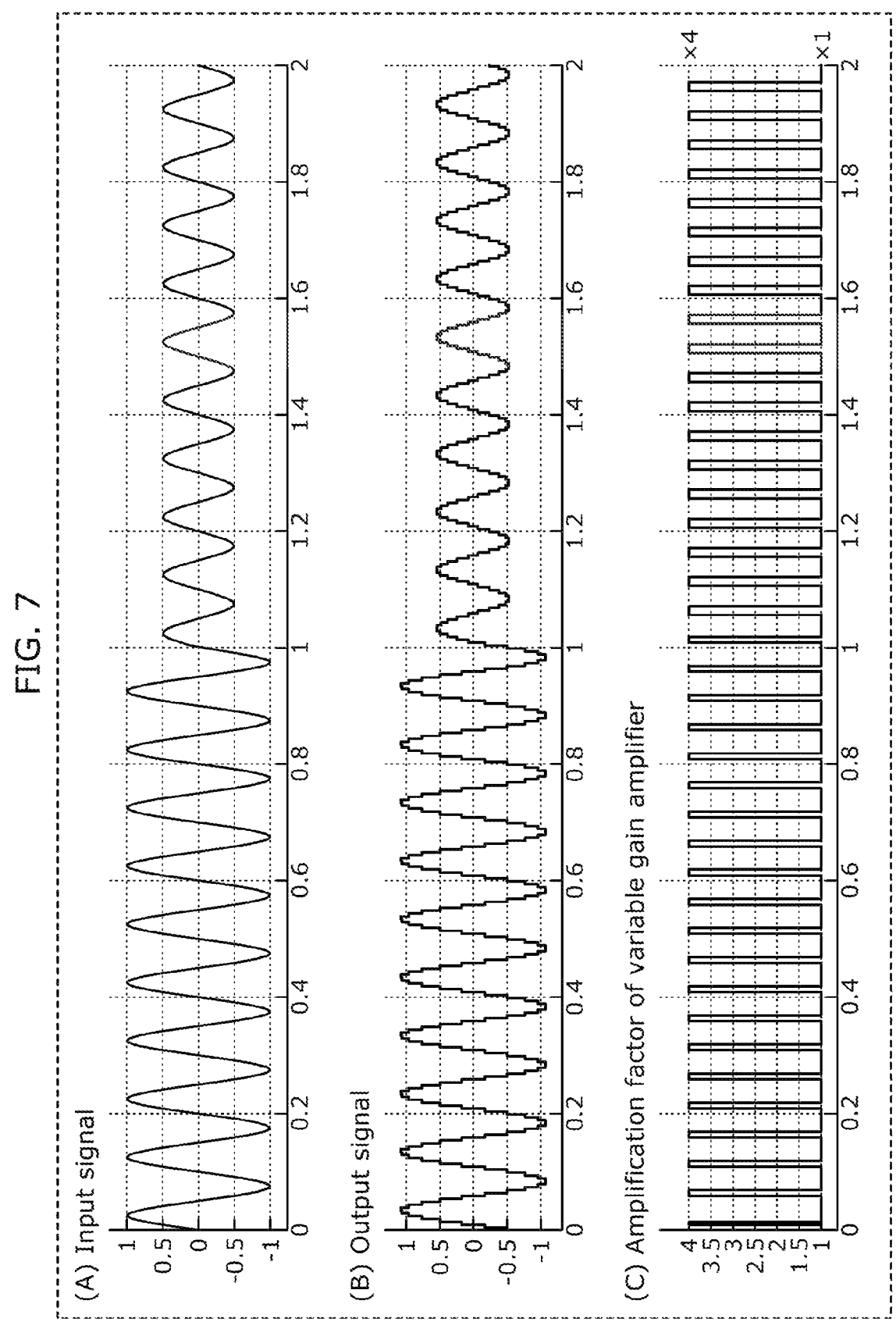
FIG. 7 is a waveform chart illustrating one example of a relationship between an analog signal input to the analog-to-digital conversion circuit according to Embodiment 1 and a digital signal output from the analog-to-digital conversion circuit.

FIG. 7 is a waveform chart illustrating one example of a relationship between an analog signal input to analog-to-digital conversion circuit 1 and a first digital signal output from analog-to-digital conversion circuit 1.

As illustrated in FIG. 7, the amplification factor of variable gain amplifier 10 is changed from a factor of one to a factor of four when the signal amplitude of an analog signal input to analog-to-digital conversion circuit 1 is near a zero-crossing. However, the weight of a second digital signal does not change even if the amplification factor of variable gain amplifier 10 is changed in analog-to-digital conversion circuit 1. For this reason, a step response of decimation filter 30 arising from a change in the amplification factor of variable gain amplifier 10 does not occur for a first digital signal.

As described above, analog-to-digital conversion circuit 1 having the above-described configuration can inhibit an unstable output.

For this reason, analog-to-digital conversion circuit 1 is useful when an input analog signal rapidly fluctuates in a wide range.

For example, in an electric vehicle operated by a lithium-ion battery, an output current value of the lithium-ion battery from the completely stopped state to the maximum output state rapidly and irregularly fluctuates from about several hundred μA to about several hundred A. Since the variation range is at least one million times greater than the value at the completely stopped state, the dynamic range for measurement of an output current value of the lithium-ion battery requires at least 120 dB. Even if a delta-sigma ADC can implement a high dynamic range, it is difficult to implement the above-described dynamic range without an AGC function. Meanwhile, a conventional delta-sigma ADC having an AGC function cannot follow the above-described rapid current change due to a response time of a feedback loop in an AGC.

In contrast, analog-to-digital conversion circuit 1 having the above-described configuration has an AGC function that implements a high dynamic range, and also has the ability to follow an abrupt current change. For this reason, analog-to-digital conversion circuit 1 having the above-described configuration is particularly useful for measurement of an output current value of a lithium-ion battery used in an electric vehicle operated by a lithium-ion battery.

Moreover, analog-to-digital conversion circuit 1 having the above-described configuration can cause weight change unit 40 to implement a configuration not including a circuit having a relatively large circuit size such as a divider.

In addition, analog-to-digital conversion circuit 1 having the above-described configuration can feed back an output of decimation filter 30 to the amplification factor of variable gain amplifier 10.

Moreover, analog-to-digital conversion circuit 1 having the above-described configuration can make a change in the amplification factor of variable gain amplifier 10 with hysteresis. Therefore, a change in the amplification factor of variable gain amplifier 10 can be made stable.

In addition, analog-to-digital conversion circuit 1 having the above-described configuration can synchronize a change in the amplification factor of variable gain amplifier 10 with the period of an output of decimation filter 30.

Moreover, analog-to-digital conversion circuit 1 having the above-described configuration can inhibit an effect of a response time taken when the amplification factor of variable gain amplifier 10 is changed to be exerted on an input to decimation filter 30. For this reason, an unstable output from analog-to-digital conversion circuit 1 can further be inhibited.

Embodiment 2

Hereinafter, an analog-to-digital conversion circuit according to Embodiment 2 which is configured by changing a part of analog-to-digital conversion circuit 1 according Embodiment 1 will be described.

The analog-to-digital conversion circuit according to Embodiment 2 that will be described hereafter omits detailed description of the same elements as those included in analog-to-digital conversion circuit 1 according to Embodiment 1 by giving the same reference numerals to the same elements, since such elements included in analog-to-digital conversion circuit 1 according to Embodiment 1 have already been described. Accordingly, differences from analog-to-digital conversion circuit 1 will be mainly described.

Figure 8:
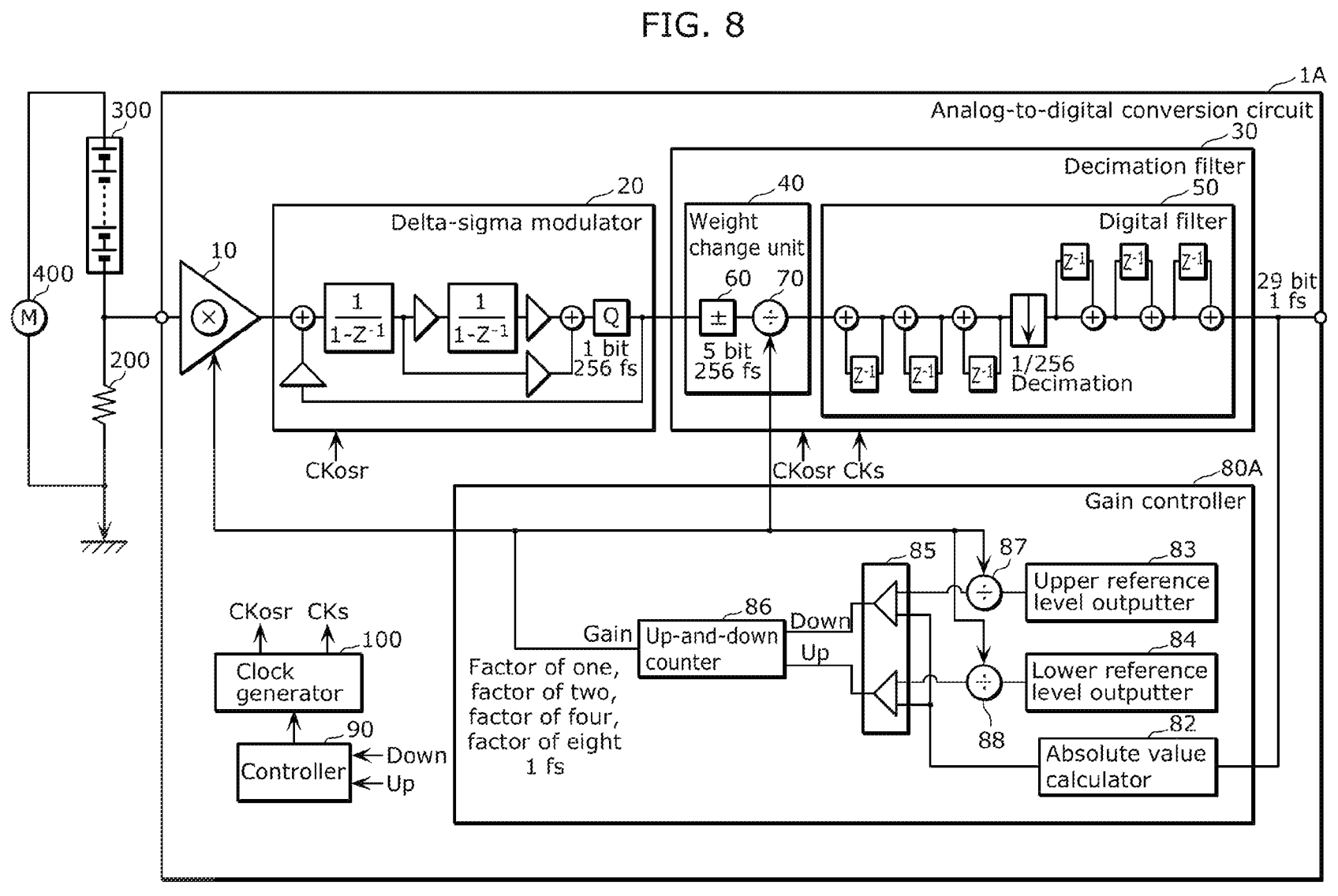

FIG. 8 is a block diagram illustrating one example of a configuration of analog-to-digital conversion circuit 1A according to Embodiment 2.

As illustrated in FIG. 8, analog-to-digital conversion circuit 1A is configured by changing, from analog-to-digital conversion circuit 1 according to Embodiment, gain controller 80 to gain controller 80A.

Gain controller 80A is configured by excluding multiplier 81 from gain controller 80 according to Embodiment 1 and including divider 87 and divider 88.

Divider 87 divides the value of an upper reference level signal output from upper reference level outputter 83 by the amplification factor indicated by a GAIN signal.

Divider 88 divides the value of a lower reference level signal output from lower reference level outputter 84 by the amplification factor indicated by the GAIN signal.

Since gain controller 80A having the above-described configuration does not include multiplier 81, a first digital signal is directly input to absolute value calculator 82. For this reason, absolute value calculator 82 in gain controller 80A outputs the absolute value of the first digital signal.

In gain controller 80 according to Embodiment 1, comparator compares the absolute value of a value obtained by multiplying the value of a first digital signal by the multiplication factor with the upper reference level and the lower reference level.

In contrast, comparator 85 included in gain controller 80A compares the absolute value of the value of a first digital signal with a value obtained by dividing the upper reference level by the amplification factor and a value obtained by dividing the lower reference level by the amplification factor.

For this reason, comparator 85 included in gain controller 80A outputs the same as comparator 85 included in gain controller 80 according to Embodiment 1.

Accordingly, gain controller 80A having the above-described configuration performs the same operation as gain controller 80 according to Embodiment 1.

[Study]

As described above, gain controller 80A performs the same operation as gain controller 80 according to Embodiment 1. For this reason, analog-to-digital conversion circuit 1A performs the same operation as analog-to-digital conversion circuit 1 according to Embodiment 1.

Embodiment 3

Hereinafter, an analog-to-digital conversion circuit according to Embodiment 3 which is configured by changing a part of analog-to-digital conversion circuit 1 according Embodiment 1 will be described.

The analog-to-digital conversion circuit according to Embodiment 3 that will be described hereafter omits detailed description of the same elements as those included in analog-to-digital conversion circuit 1 according to Embodiment 1 by giving the same reference numerals to the same elements, since such elements included in analog-to-digital conversion circuit 1 according to Embodiment 1 have already been described. Accordingly, differences from analog-to-digital conversion circuit 1 will be mainly described.

Figure 9:
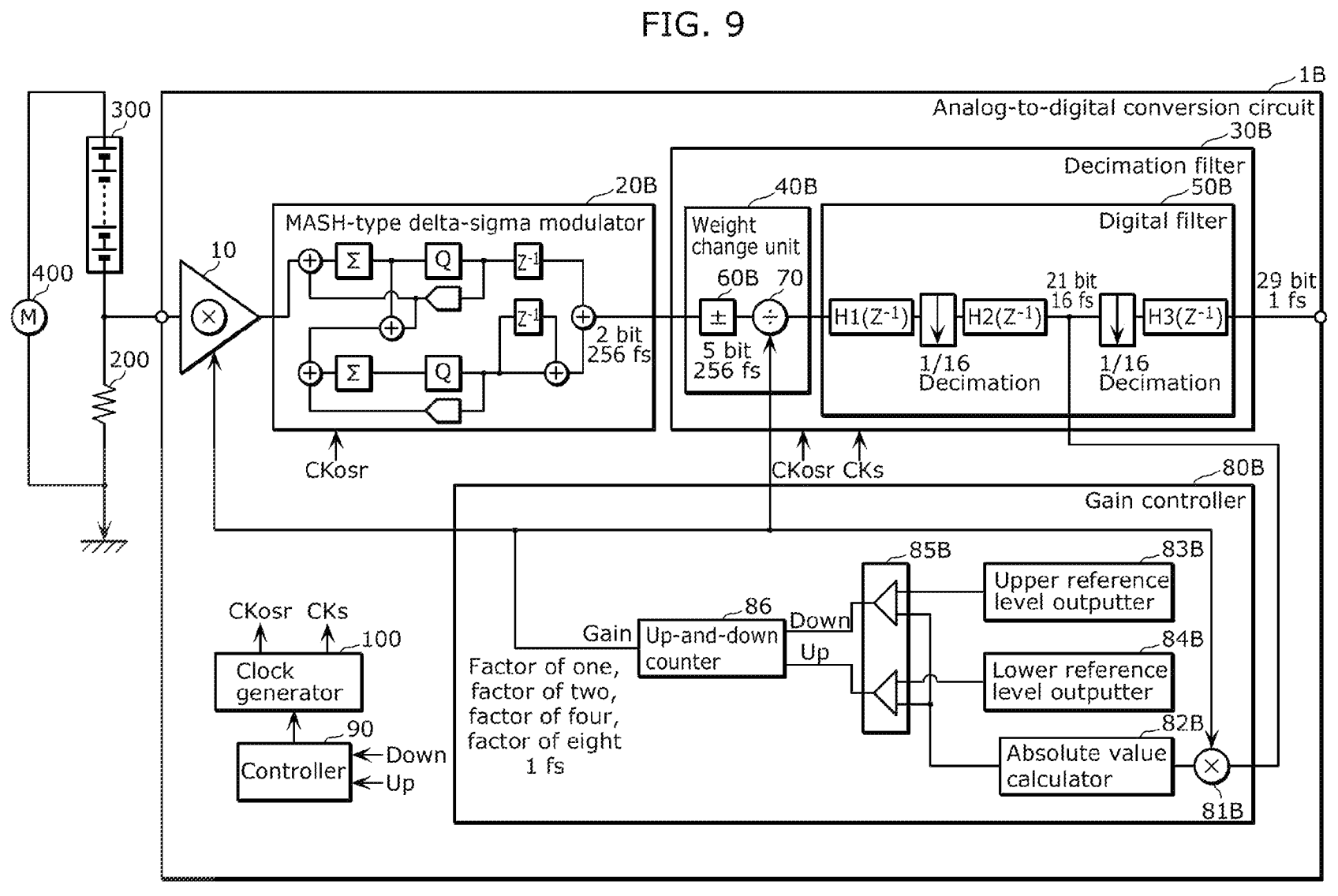

FIG. 9 is a block diagram illustrating one example of a configuration of analog-to-digital conversion circuit 1B according to Embodiment 3.

As illustrated in FIG. 9, analog-to-digital conversion circuit 1B is configured by changing, from analog-to-digital conversion circuit 1 according to Embodiment 1, delta-sigma modulator 20, decimation filter 30, and gain controller 80 to MASH-type delta-sigma modulator decimation filter 30B, and gain controller 80B, respectively.

MASH-type delta-sigma modulator 20B modulates an output of variable gain amplifier 10 to a PDM signal, and outputs the PDM signal. MASH-type delta-sigma modulator 20B here will be described as a delta-sigma modulator that has a second-order degree, performs oversampling at oversampling frequency fosr that is 256 times sampling frequency fs of analog-to-digital conversion circuit 1B, and outputs, at oversampling frequency fosr, a PDM signal of two bits indicating values of a ternary number, which are +1, 0, and −1.

Decimation filter 30B downsamples a PDM signal output from MASH-type delta-sigma modulator 20B to output a first digital signal and a fourth digital signal each of which is converted into a multi-bit digital signal. Here, decimation filter 30B will be described as a decimation filter that performs downsampling at sampling frequency fs that is $\frac{1}{256}$ of oversampling frequency fosr to output a first digital signal of 29 bits, and performs downsampling at sampling frequency 16 fs that is one-sixteenth of oversampling frequency fosr to output a fourth digital signal of 21 bits.

As illustrated in FIG. 9, decimation filter 30B is configured by changing, from decimation filter 30 according to Embodiment 1, weight change unit 40 and digital filter 50 to weight change unit 40B and digital filter 50B, respectively.

Weight change unit 40B converts a PDM signal output from MASH-type delta-sigma modulator 20B into a second digital signal weighted by multiplying the weight of the PDM signal by a reciprocal of the amplification factor of variable gain amplifier 10.

FIG. 10 is a block diagram illustrating one example of a configuration of weight change unit 40B.

As illustrated in FIG. 10, weight change unit 40B is configured by changing, from weight change unit 40 according to Embodiment 1, two's complement conversion circuit 60 to two's complement conversion circuit 60B.

Two's complement conversion circuit 60B converts a PDM signal into a third digital signal in two's complement notation which is weighted by the same weight as the PDM signal. Here, a third digital signal is a signed digital signal of five bits. More specifically, two's complement conversion circuit 60B operates at oversampling frequency fosr that is 256 times the fs, converts a PDM signal indicating a value of +1 into a third digital signal indicating 01000, converts a PDM signal indicating a value of 0 into a third digital signal indicating 00000, and converts a PDM signal indicating a value of −1 into a third digital signal indicating 11000, as illustrated in FIG. 10.

The description of analog-to-digital conversion circuit 1B will be resumed with reference to FIG. 9 again.

Digital filter 50B is a digital filter that receives a second digital signal as an input, and outputs a first digital signal and a fourth digital signal. Here, digital filter 50B downsamples a second digital signal at sampling frequency 16 fs that is one-sixteenth of oversampling frequency fosr between transfer function $H1(Z^{-1})$ and transfer function $H2(Z^{-1})$ to output a fourth digital signal of 21 bits, and further downsamples the fourth digital signal at sampling frequency fs that is one-sixteenth of sampling frequency 16 fs between transfer function $H2(Z^{-1})$ and transfer function $H3(Z^{-1})$ to output a first digital signal of 29 bits.

Gain controller 80B changes the amplification factor of variable gain amplifier 10 based on a value of a fourth digital signal. Gain controller 80B then outputs a GAIN signal indicating the amplification factor. More specifically, gain controller 80B is changed from gain controller 80 according to Embodiment 1 in that a digital signal to be input to gain controller 80B is a fourth digital signal of 21 bits, whereas a digital signal to be input to gain controller 80 is a first digital signal of 29 bits.

In accordance with the above-described change, gain controller 80B is configured by changing, from gain controller 80 according to Embodiment 1, multiplier 81, absolute value calculator 82, upper reference level outputter 83, lower reference level outputter 84, and comparator 85 to multiplier 81B, absolute value calculator 82B, upper reference level outputter 83B, lower reference level outputter 84B, and comparator 85B, respectively. More specifically, (i) multiplier 81B is configured by changing, from multiplier 81, the number of bits from 29 bits to 21 bits, (ii) upper reference level outputter 83B is configured by changing, from upper reference level outputter 83, the number of bits from 29 bits to 21 bits, (iii) lower reference level outputter 84B is configured by changing, from lower reference level outputter 84, the number of bits from 29 bits to 21 bits, and (iv) comparator 85B is configured by changing, from comparator 85, the number of bits from 29 bits to 21 bits.

[Study]

According to analog-to-digital conversion circuit 1B having the above-described configuration, elements included in gain controller which are multiplier 81B, absolute value calculator 82B, upper reference level outputter 83B, lower reference level outputter 84B, and comparator 85B, have the number of bits less than the number of bits of respective elements included in gain controller 80 according to Embodiment 1, which are multiplier 81, absolute value calculator 82, upper reference level outputter 83, lower reference level outputter 84, and comparator 85. As described above, analog-to-digital conversion circuit 1B having the above-described configuration can reduce the circuit size of gain controller 80B.

Supplementary Information

Hereinbefore, the analog-to-digital conversion circuit according to one aspect of the present disclosure has been described based on Embodiment 1 through Embodiment 3, but the present disclosure is not limited to these embodiments. Embodiments arrived at by a person of skill in the art making various modifications to the embodiments, as well as embodiments implemented by optionally combining elements in different embodiments which do not depart from the essence of the present disclosure may be included in one or more aspects of the present disclosure.

(1) In Embodiment 1, shunt resistor 200 had been described as if shunt resistor 200 is not an element of analog-to-digital conversion circuit 1. However, shunt resistor 200 may be an element of analog-to-digital conversion circuit 1. In other words, analog-to-digital conversion circuit 1 may include shunt resistor 200.

(2) In Embodiment 1, the amplification factor of variable gain amplifier 10 had been described as a power of two. However, the amplification factor of variable gain amplifier 10 need not be limited to a power of two. Nevertheless, when variable gain amplifier 10 is configured to have the amplification factor that is not a power of two in analog-to-digital conversion circuit 1, shift circuit 70 needs to be configured to divide the value of a third digital signal by the foregoing amplification factor to output a second digital signal weighted by multiplying the weight of a PDM signal by a reciprocal of the amplification factor of variable gain amplifier 10.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in analog-digital conversion circuits.

The invention claimed is:

1. An analog-to-digital conversion circuit comprising:
a variable gain amplifier;
a delta-sigma modulator that modulates an output of the variable gain amplifier to a pulse density modulation (PDM) signal; and
a decimation filter that downsamples the PDM signal to output a first digital signal that is converted into a multi-bit digital signal, wherein
the decimation filter includes:
a weight change unit that converts the PDM signal into a second digital signal that is weighted by multiplying a weight of the PDM signal by a reciprocal of an amplification factor of the variable gain amplifier; and a first digital filter that receives the second digital signal as an input, and outputs the first digital signal, the analog-to-digital conversion circuit further comprises a gain controller that changes the amplification factor based on a value of the first digital signal, and the gain controller changes the amplification factor as follows: (i) when an absolute value obtained by multiplying the value of the first digital signal by the amplification factor is greater than a first reference level, the amplification factor is halved; and (ii) when the absolute value is less than a second reference level that is less than half the first reference level, the amplification factor is doubled.

2. The analog-to-digital conversion circuit according to claim 1, wherein the amplification factor is a power of two, and the weight change unit includes:

a two's complement conversion circuit that converts the PDM signal into a third digital signal in two's complement notation which is weighted by a same weight as the PDM signal; and a shift circuit that, when the amplification factor is two to a power of n where n is an integer of zero or more, performs an arithmetic shift of n bits on the third digital signal to output the second digital signal.

3. The analog-to-digital conversion circuit according to claim 2, wherein the arithmetic shift of n bits is an arithmetic right shift of n bits.

4. The analog-to-digital conversion circuit according to claim 1, wherein the decimation filter outputs the first digital signal in a first period, and the gain controller changes the amplification factor in the first period.

5. The analog-to-digital conversion circuit according to claim 1, wherein the delta-sigma modulator temporarily holds a value of the PDM signal in synchronization with a timing of the gain controller switching the amplification factor.

6. An analog-to-digital conversion circuit comprising:

a variable gain amplifier;

a delta-sigma modulator that modulates an output of the variable gain amplifier to a pulse density modulation (PDM) signal; and a decimation filter that downsamples the PDM signal to output a first digital signal that is converted into a multi-bit digital signal, wherein the decimation filter includes:

a weight change unit that converts the PDM signal into a second digital signal that is weighted by multiplying a weight of the PDM signal by a reciprocal of an amplification factor of the variable gain amplifier; and a first digital filter that receives the second digital signal as an input, and outputs the first digital signal, the first digital filter includes:

a second digital filter that receives the second digital signal as an input, and outputs a fourth digital signal having a total number of bits less than a total number of bits of the first digital signal; and a third digital filter that receives the fourth digital signal as an input, and outputs the first digital signal, the analog-to-digital conversion circuit further comprises a gain controller that changes the amplification factor based on a value of the fourth digital signal, and the gain controller changes the amplification factor as follows: (i) when an absolute value obtained by multiplying the value of the first digital signal by the amplification factor is greater than a first reference level, the amplification factor is halved; and (ii) when the absolute value is less than a second reference level that is less than half the first reference level, the amplification factor is doubled.

7. The analog-to-digital conversion circuit according to claim 6, wherein the delta-sigma modulator temporarily holds a value of the PDM signal in synchronization with a timing of the gain controller switching the amplification factor.

8. The analog-to-digital conversion circuit according to claim 6, wherein the amplification factor is a power of two, and the weight change unit includes:

a two's complement conversion circuit that converts the PDM signal into a third digital signal in two's complement notation which is weighted by a same weight as the PDM signal; and a shift circuit that, when the amplification factor is two to a power of n where n is an integer of zero or more, performs an arithmetic shift of n bits on the third digital signal to output the second digital signal.

9. The analog-to-digital conversion circuit according to claim 8, wherein the arithmetic shift of n bits is an arithmetic right shift of n bits.

* * * * *